(12) United States Patent
Lie et al.

(10) Patent No.: US 12,154,805 B2
(45) Date of Patent: Nov. 26, 2024

(54) PATTERNED CARRIER ASSEMBLIES HAVING AN INTEGRATED ADHESIVE FILM

(71) Applicant: Daewon Semiconductor Packaging Industrial Company, Santa Clara, CA (US)

(72) Inventors: Jonathan Kevin Lie, Santa Clara, CA (US); Matthew Stanton Whitlock, Santa Clara, CA (US); Brent Dae Hermsmeier, Santa Clara, CA (US)

(73) Assignee: Daewon Semiconductor Packaging Industrial Company, Santa Clara, CA (US)

( * ) Notice: Subject to any disclaimer, the term of this patent is extended or adjusted under 35 U.S.C. 154(b) by 479 days.

(21) Appl. No.: 17/484,088

(22) Filed: Sep. 24, 2021

(65) Prior Publication Data
US 2022/0013390 A1 Jan. 13, 2022

Related U.S. Application Data

(63) Continuation of application No. PCT/US2020/024872, filed on Mar. 26, 2020.
(Continued)

(51) Int. Cl.
*H01L 21/673* (2006.01)
*H01L 21/683* (2006.01)

(52) U.S. Cl.
CPC .... *H01L 21/67336* (2013.01); *H01L 21/6836* (2013.01)

(58) Field of Classification Search
CPC ........... H01L 21/67336; H01L 21/6836; H01L 21/67333; H01L 21/67132
See application file for complete search history.

(56) References Cited

U.S. PATENT DOCUMENTS 5,833,073 A * 11/1998 Schatz ............. H01L 21/67336
206/460
5,976,955 A 11/1999 Hodges
(Continued)

FOREIGN PATENT DOCUMENTS

JP 2019014488 A 1/2019
WO 2004050782 A1 6/2004

OTHER PUBLICATIONS

"International Search Report and Written Opinion mailed on Jun. 23, 2020 for PCT Application No. PCT/US20/24872", 9 pages.

*Primary Examiner* — Cynthia L Schaller
(74) *Attorney, Agent, or Firm* — Perkins Coie LLP; Andrew T. Pettit

(57) ABSTRACT

Introduced here are carrier assemblies that include a rigid tray having a deck area with a patterned surface of cavities for receiving semiconductor components. The cavities can be designed to accommodate semiconductor components of different form factors (e.g., having different shapes, sizes, etc.). Moreover, an adhesive film can be affixed to the deck area to ensure that the semiconductor components are securely held against the top surface of the rigid tray. In some instances the adhesive film substantially conforms to the deck area, while in other instances the adhesive film extends across the opening of each cavity located in the deck area. Semiconductor component(s) can be secured to the carrier assembly based on the adhesiveness provided by the adhesive film, mechanical force provided the cavities, electrostatic force provided by the cavities, or any combination thereof.

16 Claims, 11 Drawing Sheets

Related U.S. Application Data

(60) Provisional application No. 62/824,737, filed on Mar. 27, 2019.

(56) References Cited

U.S. PATENT DOCUMENTS

| | | | |
|---|---|---|---|
| 6,230,896 B1* | 5/2001 | Lambert | H01L 21/67333 |
| | | | 206/722 |
| 9,889,967 B2* | 2/2018 | Cheah | B65D 25/10 |
| 2004/0048009 A1* | 3/2004 | Extrand | B32B 25/08 |
| | | | 428/34.1 |
| 2014/0110894 A1 | 4/2014 | Lee et al. | |
| 2015/0235882 A1* | 8/2015 | Forsyth | B29C 65/561 |
| | | | 206/722 |
| 2017/0186636 A1* | 6/2017 | Lo | H01L 21/67333 |
| 2018/0134473 A1* | 5/2018 | Zaal | B65D 73/02 |
| 2019/0067061 A1 | 2/2019 | Chang et al. | |

\* cited by examiner

900

901 Receive a semiconductor component

902 Secure the semiconductor component within a cavity accessible along the top surface of a carrier assembly

903 Transport the carrier assembly to a desired location

904 Remove the semiconductor component from the cavity

1001
Acquire an injection-molded tray

1002
Form a series of cavities within a deck area of the injection-molded tray

1003
Secure an adhesive film to at least a portion of the deck area

1004
Cause static electricity to be discharged from the injection-molded tray

1005
Allow a semiconductor component to be secured within the cavity

FIGURE 10

PATTERNED CARRIER ASSEMBLIES HAVING AN INTEGRATED ADHESIVE FILM

CROSS REFERENCE TO RELATED APPLICATION

This application is a continuation of International Application No. PCT/2020/024872, titled "Patterned Carrier Assemblies Having and Integrated Adhesive Film" and filed on Mar. 26, 2020, which claims the benefit of U.S. Provisional Application No. 62/824,737, titled "Patterned Carrier Assemblies Having and Integrated Adhesive Film" and filed on Mar. 27, 2019, which are incorporated herein by reference in their entireties.

RELATED FIELD

The present technology relates to carrier assemblies for handling, transporting, and/or storing semiconductor components and, more specifically, to rigid trays having a patterned surface of cavities for holding semiconductor components in a predetermined arrangement.

BACKGROUND

Several different products have been used to transport semiconductor components between different manufacturing/testing sites, including stick magazines, injection-molded trays, and carrier tapes. Examples of semiconductor components include semiconductor wafers and semiconductor dies. Entities will often transport semiconductor components from one location to another location to facilitate the manufacture of integrated circuits (ICs) from the semiconductor components. This is especially true for entities who are members of the Joint Electron Device Engineering Council (JEDEC), which has established standards for safely handling, transporting, and storing ICs, modules, and other semiconductor components.

Stick magazines (also referred to as a "shipping tubes") may be used to transport semiconductor components between the manufacturing site and the assembly site, as well as to store the semiconductor components at the manufacturing site and/or the assembly site. Stick magazines can also be used to feed semiconductor components to automatic-placement machines for surface mounting and through-hole mounting.

Injection-molded trays (also referred to as "shipping trays" or "carrier trays") can be designed to retain semiconductor components during component-assembly operations, during transport from the manufacturing site to the assembly site, and while feeding the semiconductor components to automatic-placement machines for surface mounting on board assemblies. Normally, injection-molded trays are designed for semiconductor components that have leads on four sides (e.g., Quad Flat Package (QFP) and thin QFP (TQFP) packages) and require lead isolation during shipping, handling, or processing.

Carrier tapes may be used to transport semiconductor components from the manufacturing site to the assembly site, as well as to store the semiconductor components at the manufacturing site and/or the assembly site. Carrier tape is often wound around a central reel. Accordingly, carrier tape may be designed such that the semiconductor components stored therein can be readily fed to an automatic-placement machine (or multiple automatic-placement machines) for surface mounting on board assemblies.

However, these technologies exhibit several limitations. For example, each technology limits the optimum quantity of semiconductor components per square area due to the inherent limits in retaining individual semiconductor components. As another example, each technology limits lateral movement during the manufacturing/testing processes due to the design limitations of individually-punched cavities, which can lead to semiconductor components being inadvertently damaged from handling. Such limitations lead to decreases in capacity/output and increases in costs.

BRIEF DESCRIPTION OF THE DRAWINGS

Various features of the technology will become more apparent to those skilled in the art from a study of the Detailed Description in conjunction with the drawings. Embodiments of the technology are illustrated by way of example and not limitation in the drawings, in which like references may indicate similar elements.

FIG. 9 is a flowchart of a process for transporting semiconductor component(s) using the carrier assemblies described herein.

FIG. 10 is a flowchart of a process for manufacturing the carrier assemblies described herein.

Figure 1A:
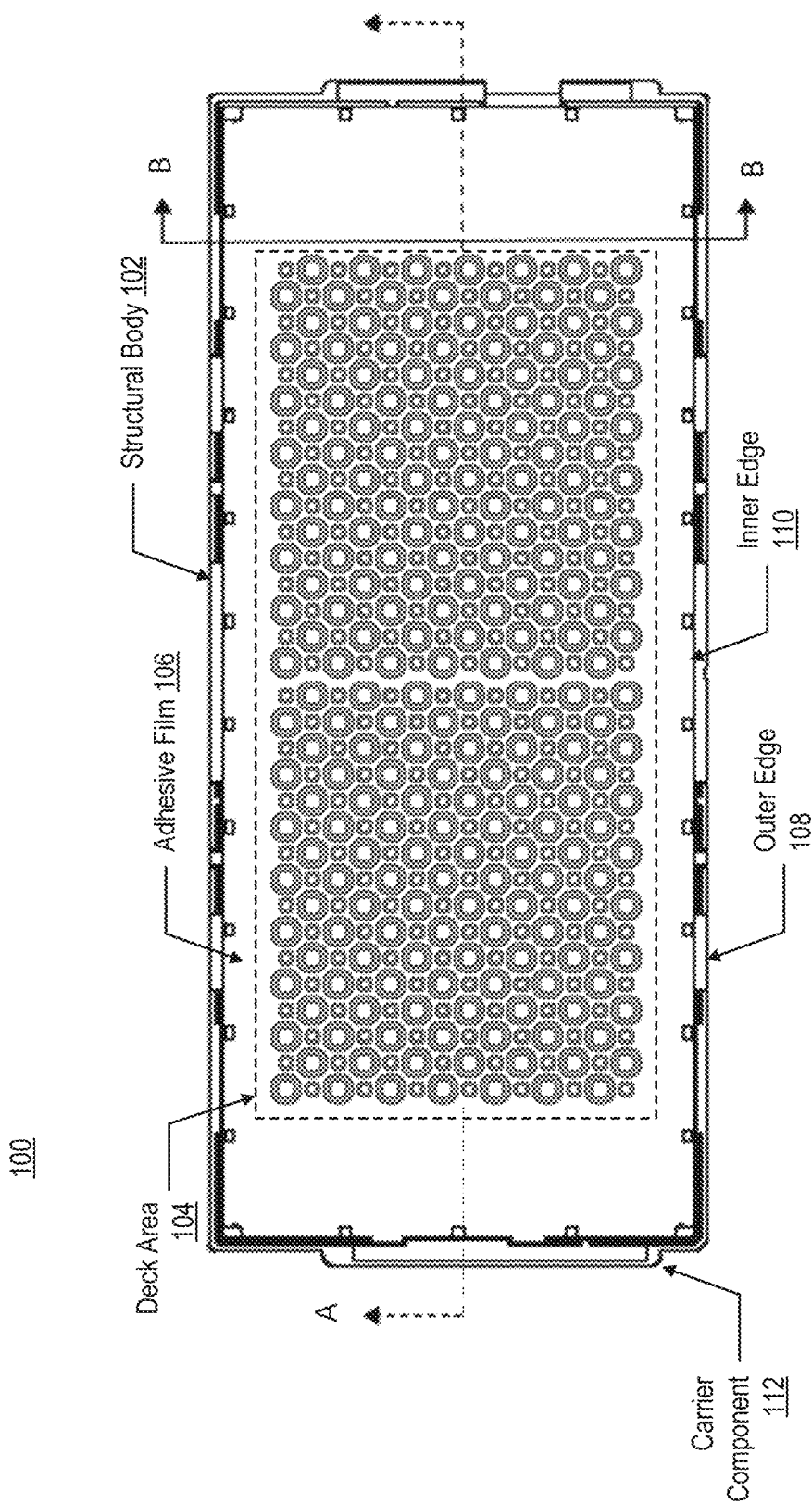
FIGS. 1A-B depict an example of a carrier assembly that includes a structural body having a patterned deck area that is at least partially covered by an adhesive film.

The drawings depict various embodiments for the purpose of illustration only. Those skilled in the art will recognize that alternative embodiments may be employed without departing from the principles of the technology. Accordingly, while specific embodiments are shown in the drawings, the technology is amenable to various modifications.

DETAILED DESCRIPTION

One option for handling, transporting, and storing semiconductor components is a carrier tray. Generally, carrier trays are designed to restrict movement of the semiconductor component(s) installed therein. For example, a carrier tray may include a conical depression designed to support a circular semiconductor wafer on its bottom surface along its outer perimeter with minimum pressure. Each carrier tray is designed for a certain kind of semiconductor component, such as semiconductor wafers which are generally thin and circular. Carrier trays have historically restricted the movement of the semiconductor component(s) installed therein by maintaining physical contact with the semiconductor component(s). For example, the aforementioned carrier tray having the conical depression may secure the circular semiconductor wafer in place with a spring-tensioned cap that encloses the circular semiconductor wafer. The spring-tensioned cap may apply pressure on the top surface of the circular semiconductor wafer along its outer perimeter to counteract the pressure applied on the bottom surface.

However, such an approach requires that the entity responsible for handling, transporting, or storing semiconductor components maintain an inventory of carrier trays having different designs (e.g., a first type of carrier tray for a first type of semiconductor component, a second type of carrier tray for a second type of semiconductor component, etc.). Maintaining the inventory can be burdensome and expensive, especially given that manufacturers have begun producing more types of semiconductor components but smaller quantities of each type of semiconductor component. This increase in personalized manufacture of semiconductor components has prompted entities to begin considering alternative options for handling, transporting, and storing semiconductor components.

Introduced here, therefore, are carrier assemblies designed to address the limitations of conventional carrier trays. The carrier assemblies described herein can include a rigid tray having a deck area with a patterned surface of cavities for receiving semiconductor components. The cavities can be designed to accommodate semiconductor components having different form factors. For example, the cavities may be designed to accommodate semiconductor having different shapes, sizes, etc. Examples of semiconductor components include semiconductor wafers (e.g., singulated wafers or diced wafers), semiconductor dies (e.g., bumped dies or bare dies), and other components used in the fabrication of integrated circuits (ICs). Although embodiments may be described in the context of semiconductor components, those skilled in the art will recognize that the carrier assemblies described herein could be designed to accommodate components to be used in the fabrication of hard disk drives (HDDs), mobile phones, laptop computers, and other electronic devices. As such, the carried assemblies described herein may be designed to accommodate "microelectronic components" or "electronic components" instead of, or in addition to, semiconductor components.

Carrier assemblies may be used to transport semiconductor components between different facilities during the manufacturing process, during the testing process, or between the manufacturing and testing processes. Carrier assemblies could also be used to store semiconductor components within a storage facility before, during, or after such processes. In some embodiments, a carrier assembly may be designed to prevent the semiconductor components installed therein from contacting each other, thereby preventing physical damage resulting from direct contact. Moreover, the carrier assembly may be designed to present the semiconductor components to a manual placement tool or an automatic placement tool (also referred to as a "pick-and-place machine") for testing, dicing, processing, etc. During a dicing procedure, a semiconductor component (e.g., a wafer) may be diced into multiple pieces, and these pieces may be used in the fabrication of one or more ICs.

Historically, carrier trays have been used in the semiconductor industry for transporting semiconductor components due to their reliability in protecting the semiconductor component(s) installed therein from damage. However, conventional carrier trays exhibit several limitations that restrict their ability to provide adequate protection to sensitive semiconductor components prone to physical damage and/or electrical damage. For example, carrier trays have traditionally been produced via an injection molding process, but an injection-molded carrier tray may inadvertently damage the semiconductor component(s) installed therein due to the external force applied to part(s) of the injection-molded carrier tray in contact with the semiconductor component(s). Moreover, an injection-molded carrier tray may fail to properly dissipate static electricity, which can further damage the semiconductor component(s) due to electrostatic discharge (ESD). Such limitations can lead to damaged semiconductor components, greater transport costs, and lower efficiency in manufacturing, testing, and storing.

To address these limitations, the carrier assemblies described herein can be provided with an adhesive film affixed to the deck area (e.g., through lamination). As further described below, the deck area may have a patterned surface of cavities for receiving semiconductor component(s). Thus, a carrier assembly may include raised wall(s) that extend upwardly from a top surface of the deck area to form void(s) for receiving a semiconductor component. In some embodiments, the adhesive film is bonded along the patterned surface as a single continuous sheet. In such embodiments, the adhesive film may conform to the patterned surface of the deck area. In other embodiments, the adhesive film is only bonded along the raised portions of the patterned surface of the deck area. Semiconductor component(s) can be secured to the carrier assembly based on the adhesion provided by the adhesive film, mechanical force provided the cavities, electrostatic force provided by the cavities, or any combination thereof. Accordingly, proper securement of semiconductor component(s) to a carrier assembly may depend on the tackiness of the constituent material(s) of the adhesive film and/or the design of the cavities.

Semiconductor components can be removed from the cavities (and thus detached from the adhesive film) either manually or automatically. For example, some entities may prefer to manually remove each semiconductor component using a tool such as a high-precision tweezers, while other entities may prefer to automatically remove each semiconductor component using a computer-implemented machine such as a pick-and-place robotic system. Accordingly, the semiconductor components may be readily separated when transported to a manufacturing facility, a testing facility, or a storage facility, though the semiconductor components may remain stable when the carrier assembly is rotated along the x-axis, y-axis, or z-axis.

One object of the technology described herein is to provide a simple carrier assembly for reliably securing semiconductor components of different sizes, shapes, etc. An entity may use the deck area of the carrier assembly as the positioning/seating plane upon which semiconductor component(s) can be secured. Such technology enables the carrier assembly to be rotated and moved, vertically and laterally, without displacing or damaging the semiconductor component(s).

Terminology

References in this description to "an embodiment" or "one embodiment" means that the particular feature, function, structure, or characteristic being described is included in at least one embodiment. Occurrences of such phrases do not necessarily refer to the same embodiment, nor are they necessarily referring to alternative embodiments that are mutually exclusive of one another.

Unless the context clearly requires otherwise, the words "comprise" and "comprising" are to be construed in an inclusive sense rather than an exclusive or exhaustive sense (i.e., in the sense of "including but not limited to"). The terms "connected," "coupled," or any variant thereof is intended to include any connection or coupling between two or more elements, either direct or indirect. The coupling/connection can be physical, logical, or a combination thereof. For example, devices may be electrically or communicatively coupled to one another despite not sharing a physical connection.

The term "based on" is also to be construed in an inclusive sense rather than an exclusive or exhaustive sense. Thus, unless otherwise noted, the term "based on" is intended to mean "based at least in part on."

When used in reference to a list of multiple items, the word "or" is intended to cover all of the following interpretations: any of the items in the list, all of the items in the list, and any combination of items in the list.

The sequences of steps performed in any of the processes described herein are exemplary. However, unless contrary to physical possibility, the steps may be performed in various sequences and combinations. For example, steps could be added to, or removed from, the processes described here. Similarly, steps could be replaced or reordered. Thus, descriptions of any processes are intended to be open-ended.

Technology Overview

FIG. 1A depicts an example of a carrier assembly 100 that includes a structural body 102 having a patterned deck area 104 that is at least partially covered by an adhesive film 106. As further described below, the carrier assembly 100 can be designed to handle semiconductor components of different sizes (e.g., different heights, widths, lengths, etc.), different shapes, etc. Said another way, the carrier assembly 100 can be designed to accommodate semiconductor components having different form factors. Accordingly, the carrier assembly 100 may be able to simultaneously or sequentially accommodate semiconductor components designed for different fabrication plants, processes, electronic devices, etc. The patterned deck area 104 of the carrier assembly 100 can be designed to maximize the density of semiconductor components for more efficient transporting, storing, etc.

In some embodiments, the carrier assembly 100 is designed to be compliant with Joint Electron Device Engineering Council (JEDEC), which sets standards for electrostatic discharge, handling, packing, and shipping of surface-mount devices. To comply with various standards, the carrier assembly 100 may be comprised of certain materials, manufactured in certain shapes/sizes, etc. Additional information on standards can be found in the related publications as maintained by JEDEC, an organization responsible for developing open standards for the microelectronics industry.

The shape and/or size of the structural body 102 may also be adapted to suit particular manufacturing, transportation, or storage needs. In some embodiments, the carrier assembly 100 includes a rectangular structural body 102. In other embodiments, the carrier assembly 100 includes a non-rectangular structural body in the form of, for example, a square, a parallelogram, an ellipse, etc. The size and/or shape of the structural body 102 may be based on, for example, the design of the semiconductor component(s) to be installed therein or a container in which the carrier assembly 100 is to be placed. For example, rectangular structural bodies may be used in combination with containers having rectangular cavities, which are commonly used in the semiconductor industry. As another example, non-rectangular structural bodies may be used in combination with containers having non-rectangular cavities (e.g., clamshell-type containers).

In some embodiments, the structural body 102 includes an outer edge 108 that defines the periphery of the carrier assembly 100 and an inner edge 110 that defines the periphery of the deck area 104. The outer edge 108 may extend along the entire outer periphery of the carrier assembly 100 in an uninterrupted manner. The inner edge 110, meanwhile, may be substantially parallel to the outer edge 108. Together, the outer edge 108 and the inner edge 110 may define opposing edges of a rim that extends upward from the top surface of the deck area 104. The rim may extend around at least a portion of the deck area 104. Here, for example, the rim extends around the entire periphery of the deck area 104 of the structural body 102. Note, however, that the rim could include interlock component(s) to facilitate connections between adjacent carrier assemblies. When a semiconductor component is set within the deck area 104 of the structural body 102, the top surface of the deck area 104 may be substantially parallel to the bottom surface of the semiconductor component and substantially perpendicular to the outer edge of the semiconductor component. In some embodiments the rim sidewall defined by the inner edge 110 is substantially orthogonal to the bottom surface of the structural body 102, while in other embodiments the rim sidewall defined by the inner edge 110 has a pitch (i.e., is angled).

Generally, the structural body 102 is comprised of a rigid material, such as a molded plastic or molded resin. Examples of such materials include polyethylene thermoplastics, polypropylene, polycarbonate, ethylene chlorotrifluoroethylene (ECTFE), and other materials suitable for creating injection-molded objects. In some embodiments, however, the structural body 102 is comprised of a pliable material (e.g., to better absorb external forces). Examples of such materials include elastomers, such as silicone rubber, and polyurethane thermoplastics. Additionally or alternatively, the structural body 102 may be comprised of a conductive material, such as silver, copper, aluminum, or a ceramic. In some embodiments the structural body 102 is comprised of a single material, while in other embodiments the structural body 102 is comprised of multiple materials. For example, the structural body 102 may be comprised of multiple materials that are mixed together prior to molding into its final form. As another example, the structural body 102 may be created using a first material able to resist physical damage and a second material (also referred to as an "anti-static material" or a "static-dissipative material") able to facilitate the dissipation of collected electricity. The second material may be sprayed onto the surface of the first material, adhered to the first material, or otherwise incorporated into the first material (e.g., during the manufacturing process).

As further described below, the structural body 102 may be comprised of material(s) known to be suitable for injection molding with the goal of producing a carrier assembly 100 that is resistant to moisture and/or electricity (e.g., to prevent static electricity collection and electrostatic discharge). For example, the structural body 102 may include a thermoformable material that, when cured (e.g., by heat, air, or radiation), forms a resilient material capable of protecting semiconductor components from physical damage and an anti-static material or a static-dissipative material.

Figure 1B:
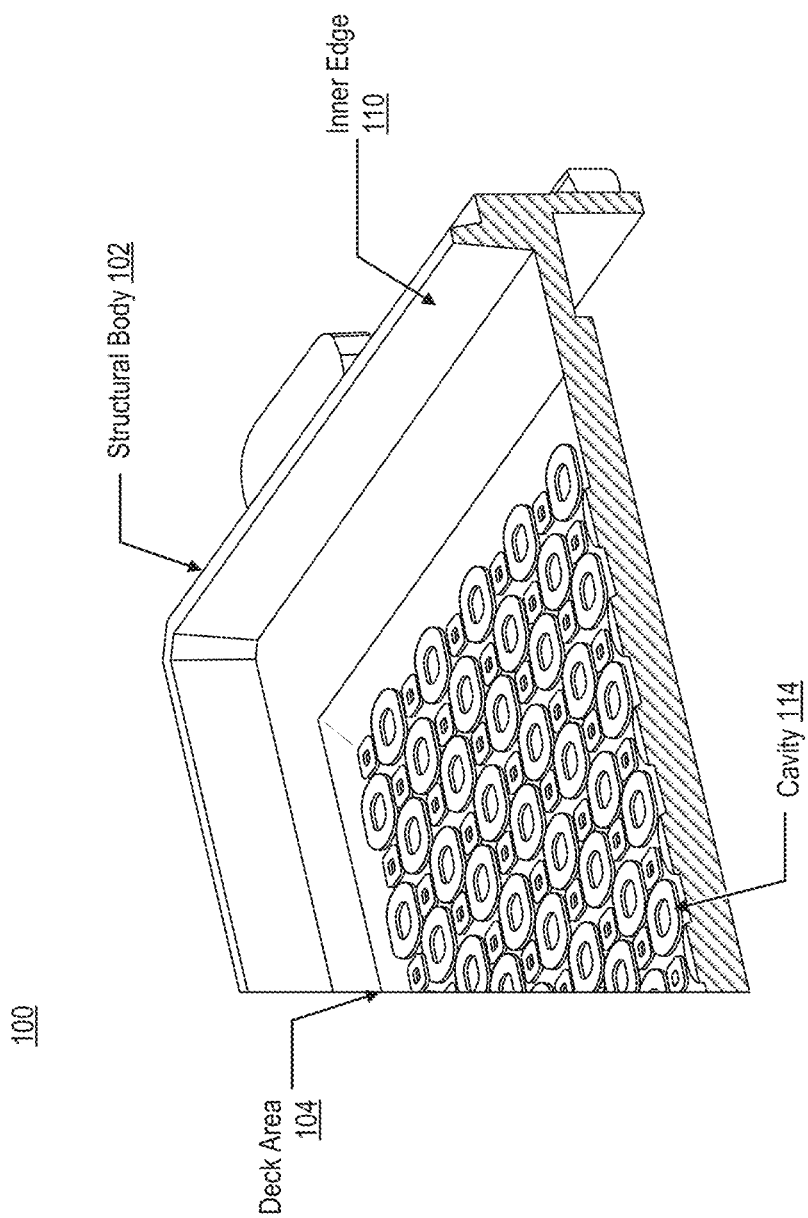

In some embodiments the adhesive film 106 is laminated along a portion of the deck area 104, while in other embodiments the adhesive film 106 is laminated along the entirety of the deck area 104 (e.g., as a single continuous sheet). As shown in FIGS. 1A-B, the deck area 104 may have a patterned surface of cavities 114 for receiving semiconductor component(s). In some embodiments, the adhesive film 106 conforms to the patterned surface. Said another way, the adhesive film 106 may be secured to the entire patterned surface of the deck area 104. In other embodiments, the adhesive film 106 is only bonded along the raised portions of the patterned surface. The adhesive film 106 may include one or more adhesive sheets. For example, in some embodiments, the adhesive film 1056 includes multiple adhesive sheets that are interconnected such that electrical current is able to flow between the adhesive sheets.

In addition to the cavities 114, the structural body 102 could include one or more perforations in the deck area 104, rim, or any combination thereof. These perforation(s) may permit air to circulate through the structural body 102, as well as allow an individual to see through the structural body 102.

The adhesive film 106 may be adhesive along both sides. That is, the adhesive film 106 may have a first adhesive side in contact with the deck area 104 and a second adhesive side in contact with the bottom surface(s) of the semiconductor component(s) secured to the carrier assembly 100 within the deck area 104. In some embodiments, the adhesive film 106 is only adhesive along a single side (e.g., the outward-facing side to which semiconductor component(s) are secured). In such embodiments, the carrier assembly 100 may include one or more fastening mechanism arranged to hold the adhesive film 104 against the top surface of the deck area 102. The fastening mechanism(s) may include clasps, clips, tabs, brackets, or any combination thereof.

As shown in FIG. 1B, the deck area 104 may include a series of cavities 114, each of which is designed to hold a separate semiconductor component. As further described below, the cavities 114 can be arranged in a geometric pattern that allows the carrier assembly 100 to accommodate semiconductor components having different form factors. Such a design allows an entity to use the carrier assembly 100 for semiconductor components manufactured in different batches, designed by different clients, designed for different products, etc. In some embodiments each cavity includes a different adhesive film, while in other embodiments a single adhesive film overlays all of the cavities 114. Moreover, in some embodiments, only a subset of the cavities 114 may include an adhesive film. For example, in FIG. 4B, the deck area 104 includes a set of larger cavities and a set of smaller cavities. An entity may discover that the adhesive film is only needed to secure semiconductor component(s) within the larger cavities.

The adhesive film 106 may be sized in such a manner to restrict subsequent movement. For example, the adhesive film 106 may be secured along at least a portion of the sidewall defined by the inner edge 110. Alternatively, the adhesive film 106 may be cut such that it does not contact the sidewall defined by the inner edge 110. Thus, the adhesive film 106 may only be in contact with the deck area 104 of the structural body 102.

The adhesive film 106 can be comprised of any suitable adhesive material having sufficient tackiness. For example, the adhesive film 106 may be comprised of a polymer-based adhesive. The adhesive film 106 can be mounted to the structural body 102 such that the adhesive film 106 is laminated along the entirety of the top surface of the deck area 104 (including any cavities, such as pre-formed, JEDEC-compliant punched cavities). In other embodiments, the adhesive film 106 may itself include cavities (also referred to as "depressions") designed to receive semiconductor component(s). For example, the adhesive film 106 may include raised circular depression(s) designed to receive circular semiconductor components, raised rectangular depression(s) to receive rectangular semiconductor components, or any combination thereof. In such embodiments, the adhesive film 106 can be affixed within a void along the top surface of the deck area 104.

The adhesive film 106 (also referred to as a "film tape") can be affixed to the deck area 104 as a single continuous sheet without any breaks. This can be done in several different ways, including via a lamination process, a spray process, or a co-extrusion process. In some embodiments, a top cover (not shown) is affixed to the top surface of the adhesive film 106. The top cover may be removed from the top surface of the adhesive film 106 before semiconductor component(s) are affixed to the adhesive film 106 (and thus to the carrier assembly 100). Those skilled in the art will recognize that the top cover may not always be present. For example, the top cover may be unnecessary if semiconductor component(s) are to be secured to the adhesive film 106 soon after the adhesive film 106 is affixed to the deck area 104.

The carrier assembly 100 may also include one or more carrier components 112. Each carrier component 112, which may be arranged along the outer edge 108 of the structural body 102, may be designed to allow for easier transportation of the carrier assembly 100. For example, carrier component(s) 112 may be arranged along opposing sides of the carrier assembly 100 to allow it (as well as any other carrier assemblies to which it is connected) to be transported with greater ease and efficiency. Each carrier component 112 may be formed into a shape that can be readily held (e.g., by an individual or a machine). Examples of such shapes include rectangular tabs/handles, semicircular tabs/handles, etc. More specifically, each carrier component 112 could include a handle, a latch, a tab, or some other known mechanism for assisting in the transport of the carrier assembly 100. In some embodiments the carrier component(s) 112 are separately engaged to the structural body 102, while in other embodiments the structural body 102 and the carrier component(s) 112 form a single monolithic component.

Figure 2:
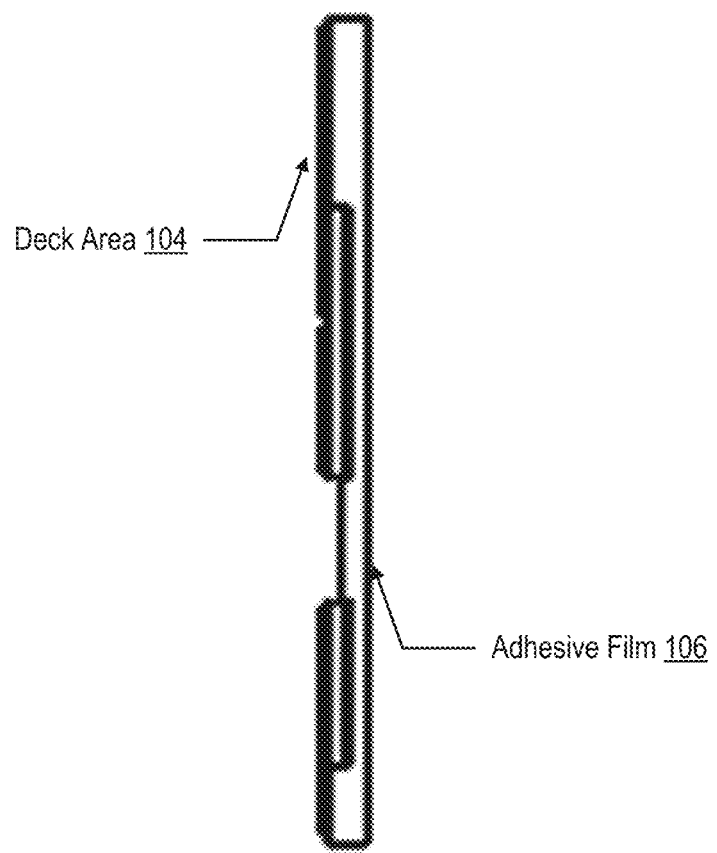
FIG. 2 illustrates a vertical section view of the carrier assembly taken along line B of FIG. 1A.

FIG. 2 illustrates a vertical section view of the carrier assembly 100 taken along line B of FIG. 1A. As noted above, an adhesive film 106 can be integrally mounted along the surface of the carrier assembly 100 within the deck area 104. The adhesive film 106 may be secured to the carrier assembly 100 such that the adhesive film 106 is substantially flush with the deck area 104. As shown in FIG. 1B, however, the adhesive film 106 may conform to any cavities formed within the deck area 104.

Figure 3:
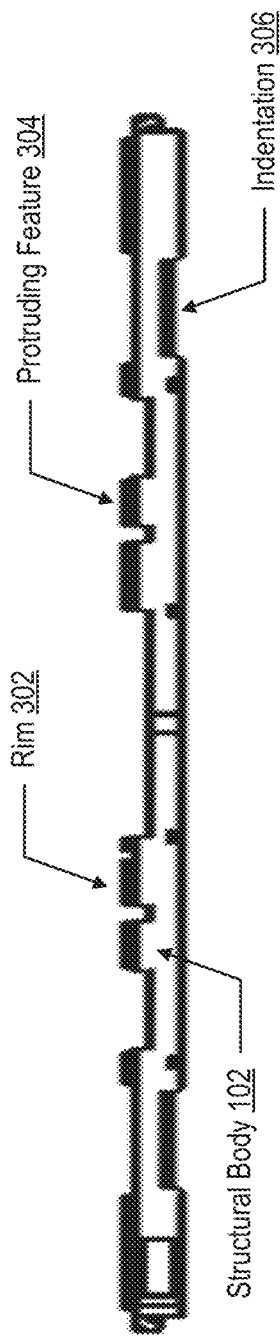
FIG. 3 illustrates a horizontal sectional view of the carrier assembly taken along line A of FIG. 1A.

FIG. 3 illustrates a horizontal sectional view of the carrier assembly 100 taken along line A of FIG. 1A. As noted above, the carrier assembly 100 may include a rim 302 that extends around at least a portion of the periphery of the deck area 104 in which semiconductor component(s) are secured. In some embodiments, the rim 302 includes interlock component(s) to facilitate connections between adjacent carrier assemblies. As shown in FIG. 3, the interlock component(s) can include protruding features 304 and/or indentations 306 designed to complement the protruding features of an upwardly-adjacent carrier assembly or a downwardly-adjacent carrier assembly. These interlock component(s) can be arranged along the planar surface of the rim 302, the underside of the structural body 102, or any combination thereof.

The interlock component(s) may also make the carrier assembly 100 more suitable for future processes. For example, when the carrier assembly 100 is used for storage or transport, it may be beneficial to stack a series of carrier assemblies on top of one another. Therefore, having a mechanical feature that naturally acts as a passive locking mechanism would ensure that these carrier assemblies do not move in such a manner that would damage the semiconductor components installed therein. While the interlock component(s) represent passive locking mechanisms, those skilled in the art will recognize that more active locking mechanisms could also be used. For example, each carrier assembly may include a latch that can be used to secure it to another carrier assembly. As another example, when a mechanical device is needed to remove the semiconductor component(s) from the carrier assembly 100, the interlock component(s) may serve as a support structure capable of mechanically interfacing with the mechanical device. For instance, a robotic arm may use an indentation for balancing, a protruding feature for positional reference, etc.

In some embodiments, the planar surface of the rim 302 is substantially co-planar with the top surface of the semiconductor component(s) secured within the carrier assembly 100. Thus, the height of the rim 302 may be based on the thickness of the semiconductor components expected to be installed within the carrier assembly 100. In other embodiments, the planar surface of the rim 302 is higher than the top surface of the semiconductor component(s) secured within the carrier assembly 100. Since the carrier assembly 100 may be designed to accommodate semiconductor components of different form factors, the height of the rim 302 may be greater than the thickest semiconductor component expected to be secured to the deck area 104. Such a design causes a space to be formed between the top surface of each semiconductor component and the bottom surface of an upwardly-adjacent carrier assembly, which may limit the likelihood that the semiconductor component suffers damage due to an external force applied by the upwardly-adjacent carrier assembly.

Figure 4:
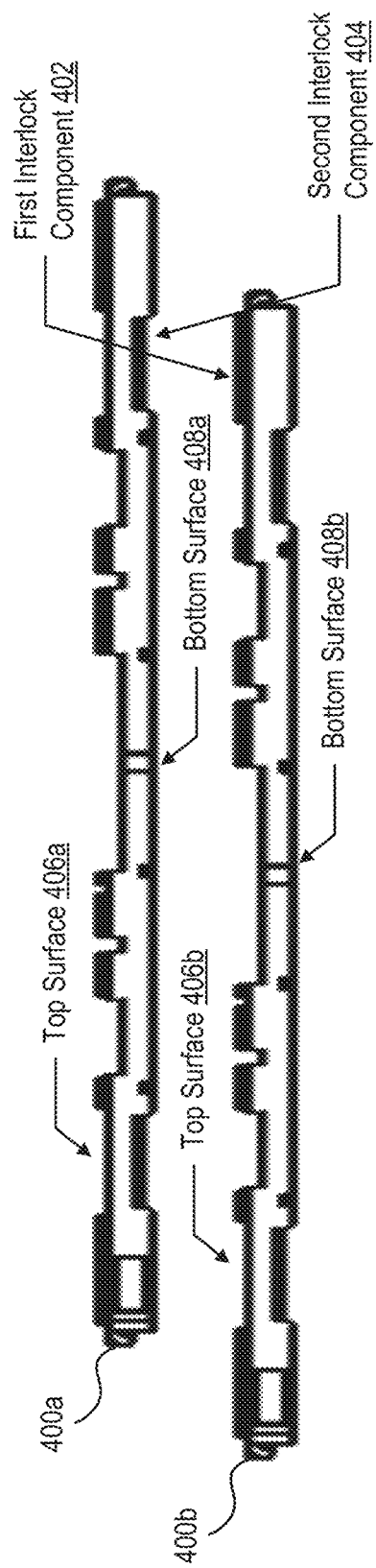
FIG. 4 includes an exploded view of multiple carrier assemblies stacked for handling, transporting, and/or storing semiconductor components.

FIG. 4 includes an exploded view of multiple carrier assemblies 400*a-b* stacked for handling, transporting, and/or storing semiconductor components. A first interlock component 402 disposed along the top surface of one carrier assembly 400*b* can be designed to interface with a second interlock component 404 disposed along the bottom surface of another carrier assembly 400*a* when the carrier assemblies 400*a-b* are brought within close proximity of one another.

Each carrier assembly 400*a-b* includes a top surface 406*a-b* and a bottom surface 408*a-b*. The top surface 406*a-b* may be defined by the planar surface of the uppermost point of the carrier assembly 400*a-b*. For example, the top surface 406*a-b* may correspond to the planar surface of the rim (i.e., while ignoring any indentations). The bottom surface 408*a-b* may be defined by the planar surface of the lowermost point of the carrier assembly 400*a-b*. In some embodiments the lowermost point of the carrier assembly 400*a-b* is the bottom surface of the structural body, while in other embodiments the lowermost point of the carrier assembly 400*a-b* is the planar surface of an interlock component (e.g., a downwardly-extending protruding feature).

As shown in FIG. 4, the bottom surface of each carrier assembly may include interlock component(s) designed to engage with complementary interlock component(s) of a downwardly-adjacent carrier assembly. Similarly, the top surface of each carrier assembly may include interlock component(s) designed to engage with complementary interlock component(s) of an upwardly-adjacent carrier assembly. Together, these interlock component(s) enable adjacent carrier assemblies to be mechanically coupled to each other without increasing the risk of harming the semiconductor component(s) stored therein.

There are at least two different types of interlock components 402, 404. A first type of interlock component extends away from a reference surface. Examples of the first type of interlock component include protrusions, projections, pins, etc. A second type of interlock component is designed to receive an interlock component of the first type. Examples of the second type of interlock component include notches, slots, recesses, etc.

Generally, the first interlock component 402 and the second interlock component 404 are different types of interlock components. Here, for example, the first interlock component 402 is an interlock component of the first type (e.g., a protrusion), while the second interlock component is an interlock component of the second type (e.g., a notch). Accordingly, the first interlock component 402 can engage a corresponding interlock component of the second type on an upwardly-adjacent carrier assembly, while the second interlock component 404 can engage a corresponding interlock component of the first type on a downwardly-adjacent carrier assembly.

While the interlock components shown in FIG. 4 extend around the entirety of the top surfaces 406*a-b* and bottom surfaces 408*a-b* of the carrier assemblies 400*a*-b, those skilled in the art will recognize that other designs are also possible. In some embodiments, each carrier assembly 400*a-b* includes a single interlock component along the top surface 406*a-b* and bottom surface 408*a-b*. For example, each carrier assembly 400*a-b* may include a notched rim that allows the bottom surface of a given carrier assembly to nest within the top surface of a downwardly-adjacent carrier assembly. In such embodiments, the structural body may have no deformities (e.g., notches) visible from the side. In other embodiments, each carrier assembly 400*a-b* includes multiple interlock components (e.g., one, two, four, or eight) arranged along the top surface 406*a-b* and/or bottom surface 408*a-b*. These interlock component(s) can be positioned in different arrangements. For example, each carrier assembly 400*a-b* could include a pair of interlock components of the first type on opposing sides of the top surface 406*a-b* and a pair of interlock components of the second type on opposing sides of the bottom surface 408*a-b*. As another example, each carrier assembly 400*a-b* could include four interlock components equally distributed along the top surface 406*a-b* and four interlock components equally distributed along the bottom surface 408*a-b*. To allow for easier stacking, the number of interlock component(s) along the top surface 406*a-b* and the bottom surface 408*a-b* are usually the same.

Figure 5:
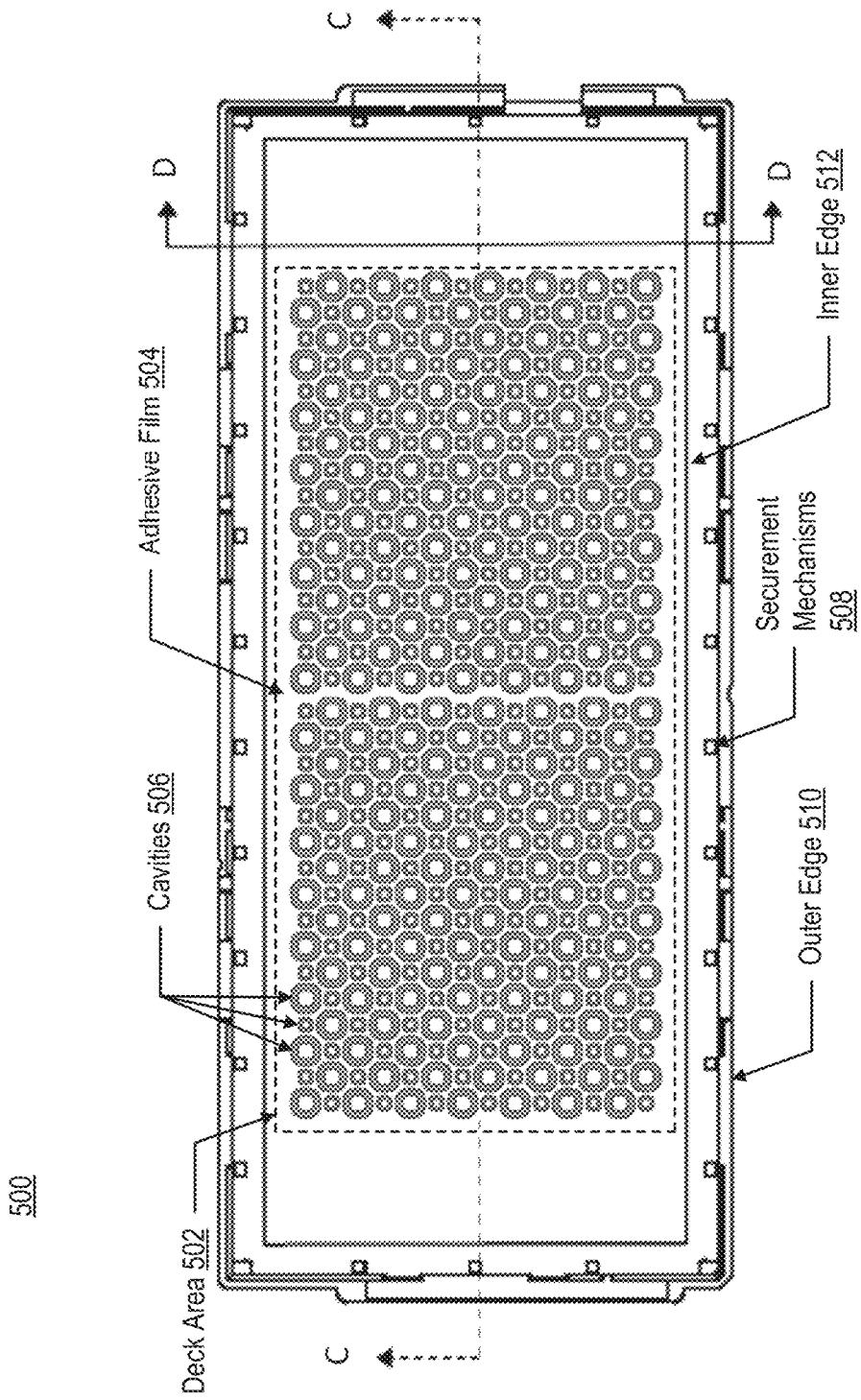
FIG. 5 includes a top plan view of a carrier assembly that includes a deck area on which an adhesive film has been affixed.

FIG. 5 includes a top plan view of a carrier assembly 500 that includes a deck area 502 on which an adhesive film 504 has been affixed. In some embodiments, the adhesive film 504 is bonded along the deck area 502 as a single continuous sheet. In such embodiments, the adhesive film 504 may conform to the cavities 506 formed along the deck area 502. In other embodiments, the adhesive film 504 is only bonded along the raised portions of the deck area 502. For example, if each cavity is defined by a wall that extends upwardly from the deck area, the adhesive film 504 may also be applied along the top surface of the wall.

In some embodiments, the adhesive film 504 is affixed to the deck area 502 using securement mechanism(s) 508 configured to grasp the adhesive film 504. For example, a series of securement mechanisms 508 designed to pinch the adhesive film 504 may be arranged along a periphery of the deck area 502. Examples of securement mechanisms include components that operate like paperclips, clamps, or binder clips. In some embodiments, the adhesive film 504 is integrally secured along a central mounting portion of the carrier assembly 500 such that the adhesive film 504 conforms to the deck area 502 as defined by the inner edge 512.

The surface adhesion (also referred to as "tackiness") of the adhesive film 504 can hold the semiconductor component(s) in place as the carrier assembly 500 is moved. For example, the adhesive film 504 can hold the semiconductor component(s) in a specified orientation during handling/transport/storage and while the semiconductor component(s) are separated/detached (e.g., manually or automatically) during a manufacturing process or a testing process. The adhesive film 504 can ensure that the semiconductor component(s) do not substantially move when the carrier assembly 500 is rotated along the x-axis, y-axis, or z-axis, or moved vertically/horizontally with respect to, for example, an automatic-placement machine.

As shown in FIG. 5, the adhesive film 504 can be affixed to the deck area 502 in a single continuous sheet along the entire length of the carrier assembly 500. That is, the adhesive film 504 can be affixed along the entire length of the carrier assembly 500 including the cavities 506. In some embodiments, the adhesive film 504 is comprised of multiple interconnected sheets. For example, a matrix of adhesive sheets can be electrically coupled by wiring or mechanically coupled by the same material as the adhesive sheets.

Generally, the adhesive film 504 does not cover the side portions disposed along the outer edge 510 of the carrier assembly 500. Said another way, the adhesive film 504 will typically not extend up the sidewall of the rim as defined by the inner edge 512. However, in some embodiments, the adhesive film 504 does at least partially cover the sidewalls of the rim extending around the deck area 502. With the adhesive film 504, the carrier assembly 500 can be used to universally transport media (e.g., singulated silicon components or silicon die of the same or different sizes) as necessary for manufacturing, shipping, and/or storing.

Figure 6A:
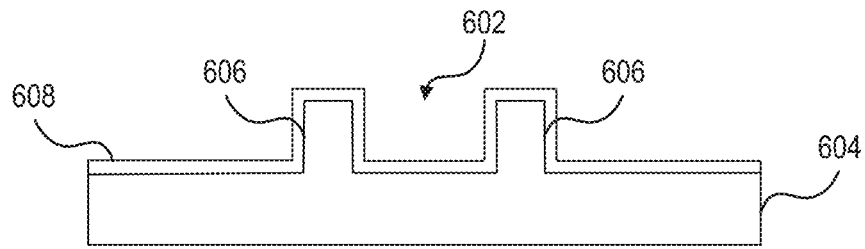
FIG. 6A includes a sectional view of a cavity formed along the top surface of a rigid tray.

FIG. 6A includes a sectional view of a cavity 602 formed along the top surface of a rigid tray 604. As shown in FIG. 6A, the cavity 602 may be defined by raised walls 606 that extend upwardly from the top surface of the rigid tray 604 to form a void. To affix a semiconductor component to the rigid tray, a protruding feature of the semiconductor component may be secured within the cavity 602. An adhesive film 608 can be bonded along the top surface of the rigid tray 604 to assist in securing the semiconductor component. In some embodiments, the adhesive film 608 conforms to the top surface of the rigid tray 604, as shown in FIG. 6A.

Figure 6B:
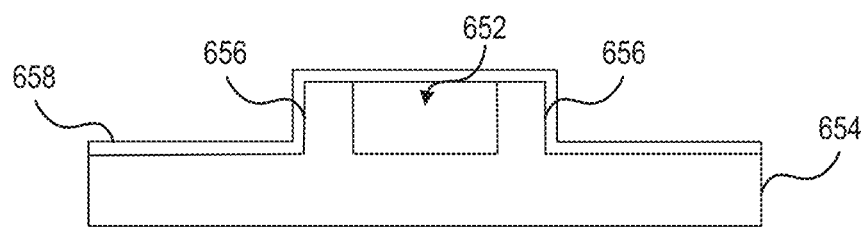
FIG. 6B includes another sectional view of a cavity formed along the top surface of a rigid tray.

In other embodiments, however, the adhesive film is not perfectly flush with the deck area of the rigid tray. FIG. 6B includes another sectional view of a cavity 652 formed along the top surface of a rigid tray 654. Similar to the cavity 602 of FIG. 6A, the cavity 652 may be defined by raised walls 656 that extend upwardly from the top surface of the rigid tray 654. Here, however, the adhesive film 658 does not conform to the top surface of the rigid tray 654. Instead, the adhesive film 658 can extend across the cavity 652. Such a design allows a protruding feature disposed along the outer surface of a semiconductor component to pierce the adhesive film 658 when interconnected with the cavity 652.

While the sidewalls of the cavities 602, 652 of FIGS. 6A-B are shown to be substantially orthogonal to the top surface of the rigid tray 604, 654, those skilled in the art will recognize that need not be the case. For example, the sidewalls may be tapered inward (e.g., to form a truncated cone with its upper/narrower radius oriented downwards) or outward (e.g., to form a truncated cone with its upper/narrower radius oriented upwards).

Figure 7:
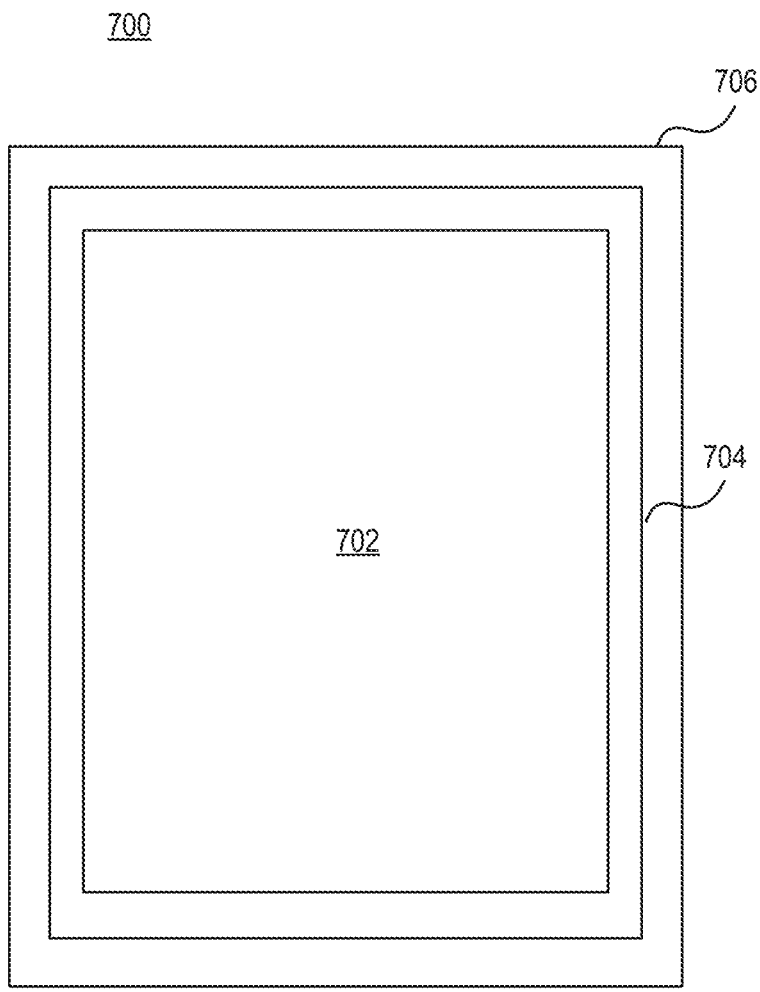
FIG. 7 includes a top plan view of a carrier assembly showing how an adhesive film can be bonded to the top surface of a deck area set within a rim that extends around a periphery of the carrier assembly.

FIG. 7 includes a top plan view of a carrier assembly 700 showing how an adhesive film 702 can be bonded to the top surface of a deck area 704 set within a rim 706 that extends around a periphery of the carrier assembly 700. To simplify the top plan view, the deck area 704 has been shown without the cavities for receiving semiconductor components. In some embodiments the adhesive film 702 covers the entire deck area 704, while in other embodiments the adhesive film 702 covers a portion of the deck area 704. Here, for example, a portion of the deck area 704 is left uncovered to form a non-adhesive border. Together with the non-adhesive rim 706, the non-adhesive border may permit the carrier assembly 700 to be more easily handled. In some embodiments, the adhesive film 702 (or at least a portion thereof) may be removable from the deck area 704.

Figure 8A:
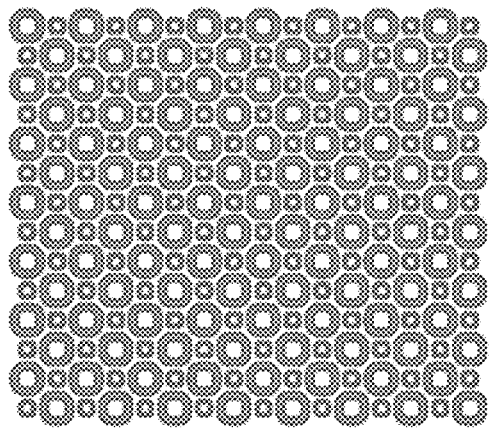
FIGS. 8A-C depict several different geometric arrangements of cavities.
Figure 8B:
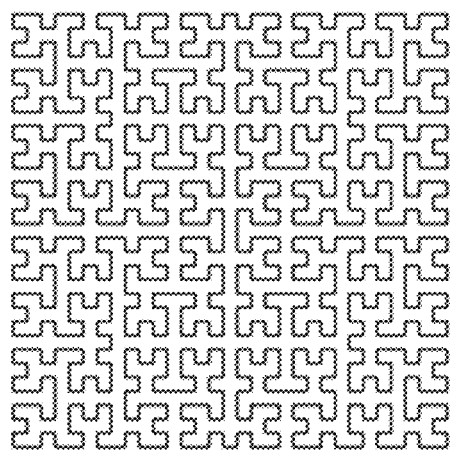
Figure 8C:
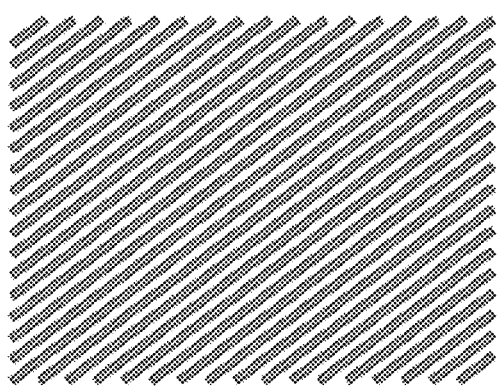

As noted above, the deck area of a carrier assembly may have a patterned surface of cavities designed to receive semiconductor components of various form factors. FIGS. 8A-C depict several different geometric arrangements of cavities. To form the cavities, raised wall(s) can extend upwardly from the top surface of the deck area. However, as shown in FIGS. 8A-C, these raised wall(s) can be various shapes and sizes.

In some embodiments, each cavity is defined by a separate raised wall that forms a void for receiving a protruding feature of a semiconductor component. Generally, these cavities are arranged such that semiconductor components installed in a non-overlapping manner maintain a spacing of at least 0.5 millimeters (mm), 1.0 mm, 1.5 mm, etc.

FIG. 8A depicts a symmetric, repeating pattern of raised walls. While the raised walls shown here are in the shape of an annulus, those skilled in the art will recognize that other shapes (e.g., ellipses, rectangles, squares) may be appropriate in some instances.

FIG. 8B depicts a symmetric, repeating pattern of cavities formed by a single branching wall. In FIG. 8B, the branching wall extends upwardly from the top surface of the deck area to form a series of interconnected voids that define the cavities.

FIG. 8C depicts a pattern of cavities formed by a series of parallel raised walls. Each pair of raised walls forms an elongate cavity (also referred to as a "trough") in which the protruding feature of a semiconductor component can be secured. In comparison to the cavities shown in FIGS. 8A-B, the trough provides greater flexibility in where semiconductor component(s) are secured.

When a semiconductor component is affixed within a given cavity shown in FIGS. 8A-C, a portion of the lower surface of the semiconductor component may contact the upper surface of at least one raised wall. In some embodiments, the raised walls are designed/arranged such that the portion of the lower surface, when measured in terms of percentage of the total lower surface of the semiconductor component, remains roughly consistent across different sizes of semiconductor components. The term "roughly consistent" means within about ten percent.

In some embodiments the pattern includes a single cavity design, while in other embodiments the pattern includes multiple cavity designs. For example, the pattern may include cavities having the same shape (e.g., an annulus) but different dimensions, as shown in FIG. 8A. As another example, the pattern may include cavities having different shapes (e.g., an annulus and a rectangle). While the branching wall shown in FIG. 8B has produced a series of rectangular cavities, those skilled in the art will recognize that the branching wall could produce cavities in various shapes, sizes, etc.

As noted above, an adhesive film may conform to the patterned surface of cavities in some embodiments. In other embodiments, the adhesive film is only bonded along the raised portions of the patterned surface of cavities. For example, the adhesive film may only be affixed to the top surface of the branching wall shown in FIG. 8B. Semiconductor component(s) can be secured within the cavities based on adhesiveness provided by the adhesive film, mechanical force provided the cavities, electrostatic force provided by the cavities, or any combination thereof. Accordingly, proper securement of the semiconductor component(s) to the carrier assembly may depend on the tackiness of the constituent material(s) of the adhesive film and/or the design of the cavities.

FIG. 9 is a flowchart of a process 900 for transporting semiconductor component(s) using the carrier assemblies described herein. Initially, an individual receives semiconductor component (step 901) that requires transport, storage, etc. Examples of semiconductor components include semiconductor wafers (e.g., singulated wafer or diced wafer), semiconductor dies (i.e., bumped die or bare die), and other electronic components used in the fabrication of integrated circuits (ICs). While the process 900 is described in the context of semiconductor components, those skilled in the art will recognize that the carrier assembly could additionally or alternatively be designed to handle, transport, and/or store components used in the fabrication of HDDs, mobile phones, laptop computers, and other electronic devices.

Thereafter, the individual can cause the semiconductor component to be secured within a cavity accessible along the top surface of a carrier assembly (step 902). For example, the individual may manually secure the semiconductor component within the cavity or prompt an automatic-placement machine to secure the semiconductor component within the cavity. Generally, the carrier assembly includes an adhesive film that includes a tacky upper surface for securing the semiconductor component to the carrier assembly. However, in some embodiments, the semiconductor component is secured to the carrier assembly solely though mechanical force applied by the cavity, electrostatic force applied by the cavity, or any combination thereof. The cavity may be one of multiple cavities arranged in a matrix pattern designed to maximize density of semiconductor components along the deck area of the carrier assembly. For example, the individual may secure the semiconductor component in a predetermined location with respect to other semiconductor components secured to the carrier assembly.

The carrier assembly can then be transported to a desired location (step 903). During transport, the carrier assembly can be moved along the x-axis, y-axis, or z-axis without substantially moving or damaging the semiconductor component. Upon receipt of the carrier assembly by a recipient (e.g., an IC manufacturer), the semiconductor component can be removed by simply overcoming the surface tackiness provided by the adhesive film, mechanical force provided the cavities, and/or electrostatic force provided by the cavities (step 904). Removal may be done manually (e.g., by a human hand) or automatically (e.g., by an automatic-placement machine).

FIG. 10 is a flowchart of a process 1000 for manufacturing the carrier assemblies described herein. Initially, a manufacturer can acquire an injection-molded tray (step 1001). In some embodiments, rather than acquire the injection-molded tray, the manufacturer creates the tray via an injection molding process. Generally, the injection-molded tray is comprised of a rigid material, such as a molded plastic or molded resin. Examples of such materials include polyethylene thermoplastics, polypropylene, polycarbonate, ECTFE, and other materials suitable for creating injection-molded objects. In some embodiments, however, the injection-molded tray is comprised of a pliable material (e.g., to better absorb external forces). Examples of such materials include elastomers, such as silicone rubber, and polyurethane thermoplastics. Additionally or alternatively, the injection-molded tray may be comprised of a conductive material, such as silver, copper, aluminum, or a ceramic. In some embodiments the injection-molded tray is comprised of a single material, while in other embodiments the injection-molded tray is comprised of multiple materials. For example, the injection-molded tray may be comprised of multiple materials that are mixed together prior to molding into its final form. As another example, the injection-molded tray may be created using a first material able to resist physical damage and a second material (also referred to as an "anti-static material" or a "static-dissipative material") able to facilitate the dissipation of collected electricity. The second material may be sprayed onto the surface of the first material, adhered to the first material, or otherwise incorporated into the first material (e.g., during the manufacturing process).

The manufacturer can then form a series of cavities within a deck area accessible along the top surface of the injection-molded tray (step 1002). This can be done in several different ways. In some embodiments, raised wall(s) are produced during the injection molding process. In such embodiments, the raised wall(s) and tray may form a single monolithic component. In other embodiments, raised wall(s) are added to the injection-molded tray within the deck area. For example, the manufacturer may secure the raised wall(s) to the injection-molded tray using an adhesive, mechanical connectors (e.g., screws and nuts), or any combination thereof.

The manufacturer can then secure an adhesive film to at least a portion of the deck area (step 1003). For example, the adhesive film may be affixed to the entirety of the deck area as a single continuous (i.e., unbroken sheet). This can be done in several different ways, including via a lamination process, a spray process, or a co-extrusion process. In some embodiments, the adhesive film is secured against the deck area using securement mechanism(s), such as clasps, clips, tabs, brackets, or any combination thereof. The adhesive film may have sufficient bonding strength such that is can be integrally mounted into any cavities formed in the deck area. Alternatively, the adhesive film may be bonded to the deck area such that it extends across each cavity. In such embodiments, a void may be formed within the cavity beneath the adhesive film, as shown in FIG. 6B.

The adhesive film may be activatable with ultraviolet (UV) radiation, heat, air, time, or any combination thereof. For example, after securing a semiconductor component within a cavity (and thus affixing the semiconductor component to the adhesive film), the carrier assembly may be exposed to a curing mechanism designed to emit UV radiation, heat, or air.

In some embodiments, the manufacturer causes static electricity to be discharged from the injection-molded tray (step 1004). For example, the manufacturer may discharge static electricity from the injection-molded tray by initiating contact with a grounded object. As another example, the manufacturer may discharge static electricity from the injection-molded tray by installing object(s), such as a ground plane, that will facilitate the discharge. Discharging static electricity reduces the likelihood of harming any semiconductor components stored in the carrier assembly due to static shock or electricity otherwise passing through when it should not.

Thereafter, the manufacturer can allow a semiconductor component to be secured within the cavity (step 1005). Semiconductor components may utilize the mechanical force and/or electrostatic force provided by the cavities, as well as the surface energy and/or tackiness of the adhesive film for seating semiconductor components at a certain density (e.g., a maximum continuous density) along the deck area of the carrier assembly. The semiconductor component may include a protruding feature designed to mate with the cavity formed in the deck area of the carrier assembly. As noted above, in some embodiments, the protruding feature may puncture the adhesive film as it enters the cavity.

Unless contrary to physical possibility, it is envisioned that the steps described above may be performed in various sequences and combinations. For example, the manufacturer may acquire an injection-molded tray that already includes an adhesive film. Therefore, in some instances the manufacturer may only need to secure semiconductor component(s) within the cavities formed in the deck area of the carrier assembly, and then provide the carrier assembly to another entity (e.g., a manufacturer of ICs).

Additional steps could also be included in some embodiments. For example, after the semiconductor component(s) have been secured within the cavities, a cover tape may be applied to hold the semiconductor component(s) in place. The cover tape may only be used in certain situations (e.g., long-distance transport or long-term storage) where the carrier assembly is expected to undergo bumping, shaking, etc.

Remarks

The foregoing description of various embodiments of the claimed subject matter has been provided for the purposes of illustration and description. It is not intended to be exhaustive or to limit the claimed subject matter to the precise forms disclosed. Many modifications and variations will be apparent to one skilled in the art. Embodiments were chosen and described in order to best describe the principles of the invention and its practical applications, thereby enabling those skilled in the relevant art to understand the claimed subject matter, the various embodiments, and the various modifications that are suited to the particular uses contemplated.

Although the Detailed Description describes certain embodiments and the best mode contemplated, the technology can be practiced in many ways no matter how detailed the Detailed Description appears. Embodiments may vary considerably in their implementation details, while still being encompassed by the specification. Particular terminology used when describing certain features or aspects of various embodiments should not be taken to imply that the terminology is being redefined herein to be restricted to any specific characteristics, features, or aspects of the technology with which that terminology is associated. In general, the terms used in the following claims should not be construed to limit the technology to the specific embodiments disclosed in the specification, unless those terms are explicitly defined herein. Accordingly, the actual scope of the technology encompasses not only the disclosed embodiments, but also all equivalent ways of practicing or implementing the embodiments.

The language used in the specification has been principally selected for readability and instructional purposes. It may not have been selected to delineate or circumscribe the subject matter. It is therefore intended that the scope of the technology be limited not by this Detailed Description, but rather by any claims that issue on an application based hereon. Accordingly, the disclosure of various embodiments is intended to be illustrative, but not limiting, of the scope of the technology as set forth in the following claims.

What is claimed is:

1. A carrier assembly comprising:
   a rigid tray that includes
      a deck area having a patterned surface of cavities for receiving semiconductor components,
         wherein the cavities are defined by a branching wall that extends upwardly from a top surface of the deck area to form interconnected voids, and
      a rim that extends around at least a portion of a periphery of the deck area; and
   an adhesive film affixed to at least a portion of the deck area,
      wherein the adhesive film includes a tacky upper surface for securing the semiconductor components within the interconnected voids formed by the branching wall.

2. The carrier assembly of claim 1, wherein the patterned surface includes cavities of at least two different sizes, shapes, or any combination thereof.

3. The carrier assembly of claim 1, wherein the adhesive film is affixed to the at least a portion of the deck area as a single continuous sheet during a lamination process.

4. The carrier assembly of claim 3, wherein the adhesive film conforms to the cavities.

5. The carrier assembly of claim 1, wherein the adhesive film is only affixed to a top surface of the branching wall that is substantially parallel to the top surface of the deck area.

6. The carrier assembly of claim 1, wherein the patterned surface aids in securement of the semiconductor components to the deck area in a predetermined arrangement while maintaining an inter-component spacing of at least 1 millimeter (mm).

7. The carrier assembly of claim 1, wherein the raised cavities secure the semiconductor components to the deck area through mechanical force, electrostatic force, or any combination thereof.

8. The carrier assembly of claim 1, wherein the branching wall forms a repeating, symmetric pattern of cavities.

9. The carrier assembly of claim 8,
   wherein when a semiconductor component is affixed within a given cavity, a portion of a lower surface of the semiconductor component contacts an upper surface of the branching wall, and
   wherein the portion of the lower surface of the semiconductor component, when measured in terms of percentage of total area of the lower surface, remains roughly consistent across different sizes of semiconductor components.

10. The carrier assembly of claim 1, wherein the rigid tray includes perforations through the deck area, the rim, or any combination thereof.

11. The carrier assembly of claim 1, wherein the adhesive film is removable from the at least a portion of the patterned surface of the deck area.

12. The carrier assembly of claim 1,
   wherein the adhesive film is affixed to a top surface of the branching wall, and wherein when a protruding feature of a semiconductor component engages a cavity along the patterned surface of the deck area, the protruding feature of the semiconductor component punctures the adhesive film.

13. The carrier assembly of claim 1, wherein the adhesive film is applied as a fluid, an aerosol, or a solid.

14. The carrier assembly of claim 1, wherein the rigid tray, including the branching wall, is formed as a single component during an injection molding process.

15. The carrier assembly of claim 1, wherein the adhesive film is activatable with ultraviolet radiation, heat, time, or any combination thereof.

16. The method carrier assembly of claim 1,
wherein the adhesive film includes multiple adhesive sheets, and
wherein the multiple adhesive sheets are interconnected such that electrical current is able to flow between the adhesive sheets.

* * * * *